United States Patent
Lopatinsky et al.

(10) Patent No.: US 7,239,514 B2
(45) Date of Patent: Jul. 3, 2007

(54) HEAT TRANSFER STRUCTURE FOR ELECTRONIC DEVICES

(75) Inventors: Edward Lopatinsky, San Diego, CA (US); Martin Richard Mayer, San Diego, CA (US); Lev Fedoseyev, El Cajon, CA (US)

(73) Assignees: Industrial Design Laboratories Inc., San Diego, CA (US); Advanced Digital Logic Inc., San Diego, CA (US)

( * ) Notice: Subject to any disclaimer, the term of this patent is extended or adjusted under 35 U.S.C. 154(b) by 0 days.

(21) Appl. No.: 11/295,326

(22) Filed: Dec. 6, 2005

(65) Prior Publication Data

US 2007/0127209 A1   Jun. 7, 2007

(51) Int. Cl.
*H05K 7/20* (2006.01)
(52) U.S. Cl. ...................................... 361/700
(58) Field of Classification Search ............... 361/700, 361/719, 704, 707, 699, 697, 695; 174/15.2; 257/715; 165/80.4, 104.26
See application file for complete search history.

(56) References Cited

FOREIGN PATENT DOCUMENTS

| GB | 2293446 | * | 3/1996 |
| JP | 9-232781 | * | 9/1997 |
| JP | 2005-142328 | * | 6/2005 |

* cited by examiner

*Primary Examiner*—Javaid H. Nasri

(57) ABSTRACT

A heat transfer structure for electronic devices comprises at least two electronic devices coupled with corresponding heat adaptors, a high heat conductivity plate and at least two heat pipes spaced between the plate and the heat adaptors. Each of heat pipes comprises an adiabatic section located between evaporating and condensing sections. Each of heat adaptors from one side is in a tight contact with the electronic device while the other side is thermally connected with the evaporating section of at least one of heat pipes. The adiabatic section is made like a bend with at least one curvature radius, thus serves like a displacement compensator. The condensing section of each heat pipes is thermally connected with the plate.

7 Claims, 9 Drawing Sheets

HEAT TRANSFER STRUCTURE FOR ELECTRONIC DEVICES

FIELD OF THE INVENTION

The present invention relates generally to cooling systems. More particularly, the present invention relates to cooling systems for regulating the temperature of electronic devices. The present invention is particularly, but not exclusively, useful for cooling systems that removes heat out from several processors and regulate the temperature of electronic devices for embedded systems.

BACKGROUND OF THE INVENTION

The regulation of the temperature of electronic devices like processors due to heat generated inside is an important consideration during the design of an electronic device. Cooling is important because if left unchecked, heat can cause electronic devices to malfunction during use or lead to premature device failure. As improvements in processor speed occur, the amount of heat generated by the faster processors also increases.

Another factor that aggravates the need for improved heat removal cooling systems is the trend towards making computing devices smaller and especially thinner. The trend toward smaller and thinner electronic devices having larger, faster processors renders the traditional heat removal cooling systems inadequate for several reasons. First, smaller devices having faster processors result in an increased density of heat producing by electronic devices leading to higher concentrations of heat. Second, a decreased amount of space is available for temperature regulating devices. In order to decrease the system space, some designs offering a single heat dissipation module that able to cool several electronic components.

There are numerous designs of cooling systems for electronic devices that include a blower-assisted heatsink located directly at the electronic device. But the problems became more dramatically when an electronic structure, for example, like an embedded system comprises several electronic devices. In this case it is practically impossible to provide a coincidence of the contact surfaces of the electronic devices with the contact surface of the heatsink. Therefore, it is very difficult to provide a good tight contact with low thermal resistance between each heatsink and electronic devices compared to the heatsinks that are individually installed on every electronic component. As a result, when a single common heatsink or heat spreader coupled with several electronic devices, it's nearly impossible to provide tight attachment with every processor and the thermal resistance increases drastically. Therefore the cooling efficiency of such system is not sufficient enough.

For solving the mentioned problem related with cooling of several electronic devices the heat transfer structures used often between the electronic devices and the heatsink. Special designed heat transfer elements with certain flexibility like heat pipes or high heat conducting elements that allow providing a good thermal contact with the electronic devices and heatsink.

There are known devices of this type with special designed flexible heat pipes, for example, US Patent Application No. 2004/0240184 "Circuit Cooling Apparatus". The heat transfer structure according to this design comprises two heat pipes providing linear and angular displacements due to their special corrugated shaped design. The each heat pipe comprises a condenser, an evaporator and two separated wick members spaced inside of the corrugated container. But such design is complicated and, therefore expensive and not reliable enough.

There is also a heat transmission apparatus according to the Japanese Patent No. JP2005142328 designed for solving the same problem when several electronic devices are placed at the same circuit board. The heat transmission apparatus comprises heat transmitting means which are formed of different material having both thermal conductivity and resiliency and are arranged in a space between the electronic devices and the heat dissipated element like a heatsink. However, in comparison with heat pipes these heat transmitting means having much lower heat conductivity that decreases the system cooling efficiency.

There is also known the heat transfer structure described in the Japanese Patent No. JP9232781 "IC Cooling Structure". According to this patent the design comprises the spiral bodies which are respectively constituted of a plurality of fine wires having high heat conductivity and consist of a flexible metal. Like a previous design, in comparison with heat pipes these spiral bodies have much lower heat conductivity and much higher thermal resistance. Therefore it has not sufficient cooling efficiency.

The main problem of all known heat transfer structures that cools several electronic devices located at one circuit board—is that all designs can not resolve the contradiction between the high cooling efficiency on the one hand and complicity and reliability on the other hand.

Therefore, it would be generally desirable to provide a low profile reliable and not complicated and efficient heat transfer structure for several electronic devices that overcomes mentioned problem.

SUMMARY OF THE INVENTION

According to the present invention a heat transfer structure for electronic devices comprises at least two electronic devices coupled with corresponding heat adaptors, a high heat conductivity plate and at least two heat pipes spaced between the plate and the heat adaptors. Each of the heat pipes comprises an adiabatic section located between evaporating and condensing sections. Each of the heat adaptors from one side is in a tight contact with the electronic device while the other side is thermally connected with the evaporating section of at least one of the heat pipes. The adiabatic section is made like a bend with at least one curvature radius, thus serving like a displacement compensator and the condensing section of each heat pipes is thermally connected with the plate.

The heat adaptors might be soldered with at least a part of the evaporating section of the heat pipes thus providing a good thermal contact between adaptors and heat pipes.

The preferred embodiment according to the present invention comprises two electronic devices, two heat adaptors and two heat pipes; each of the heat adaptors is thermally connected with one of the heat pipes correspondingly. Each of the heat pipes is V-shaped in plane view, thus the compensator located at the vertex of the V-shape form and made like a spiral. The heat pipes in plane view are located substantially symmetrically in respect to the line connected the centers of the electronic devices.

According to the other embodiment of the present invention evaporating and condensing sections of each heat pipes are in parallel and spaced on the one side of the spiral. And according to the variant of this embodiment evaporating and condensing sections of each heat pipes are in parallel planes and spaced on the opposite sides of the spiral.

The foregoing and other objectives, features and advantages of the invention will be more readily understood upon consideration of the following detailed description of the invention, taken in conjunction with the accompanying drawings.

DETAILED DESCRIPTION OF PREFERRED EMBODIMENTS

Figure 1:
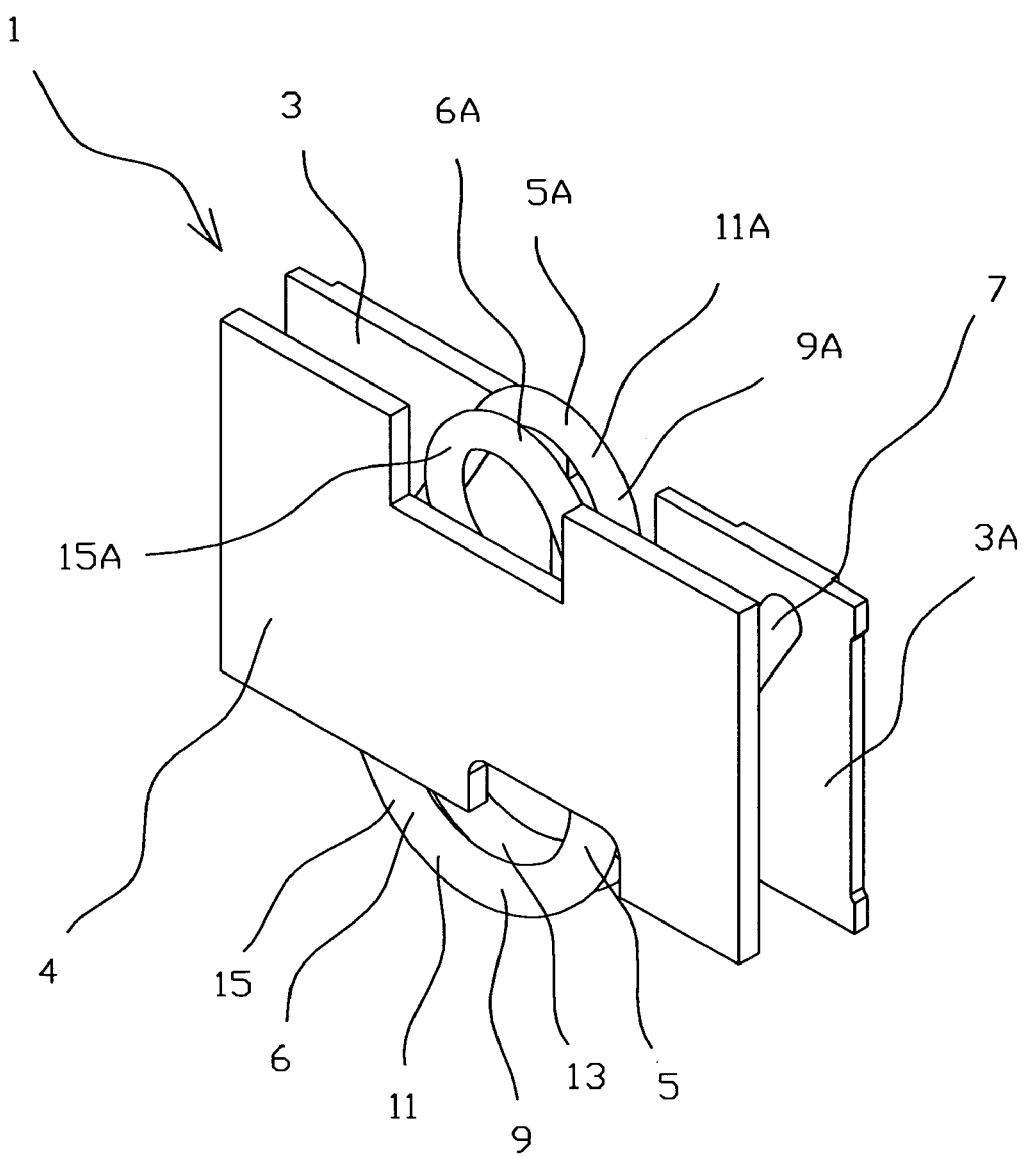
FIG. 1 is a perspective view showing the preferred embodiment of the heat transfer structure for electronic devices for the present invention.
Figure 2:
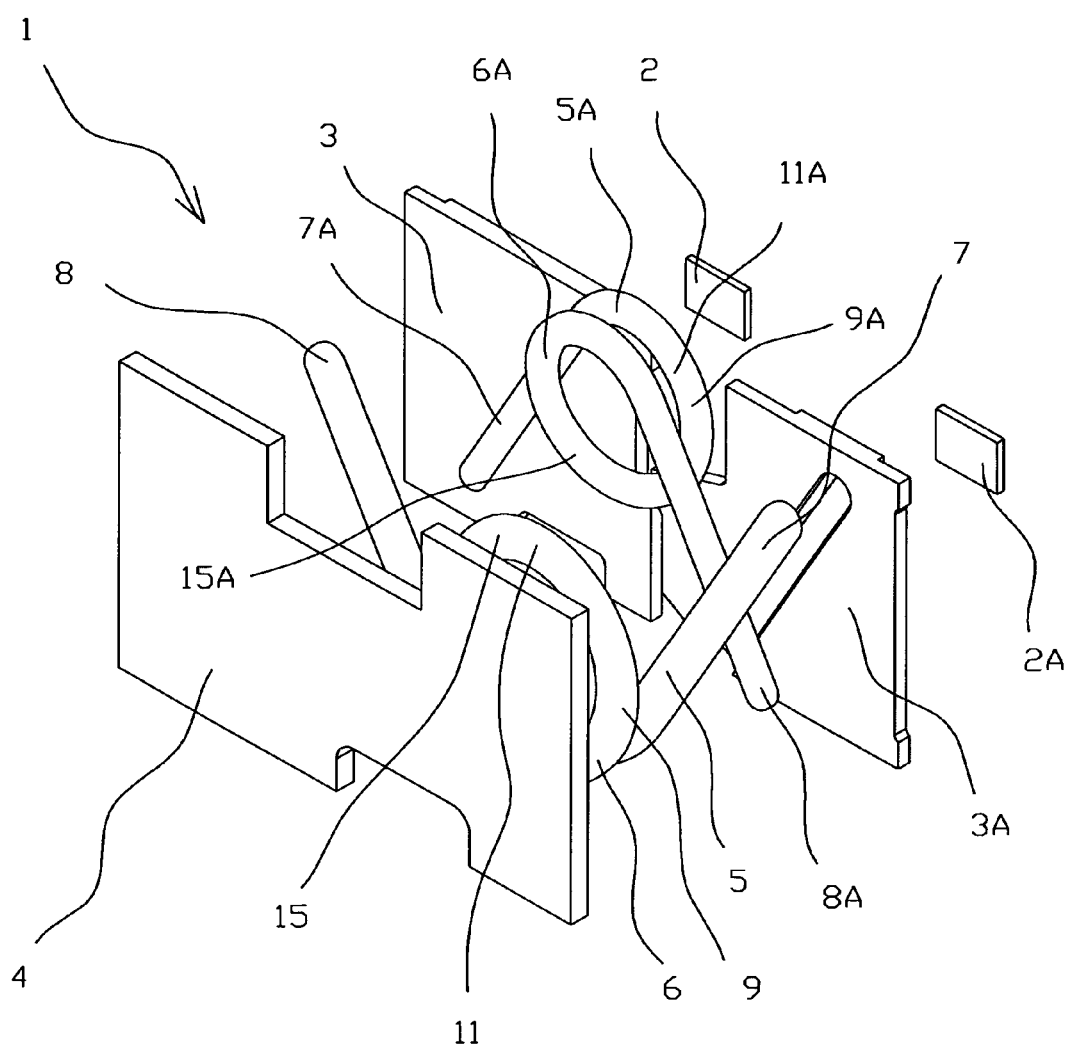
FIG. 2 is an exploded view showing the preferred embodiment of the heat transfer structure for the present invention.
Figure 3:
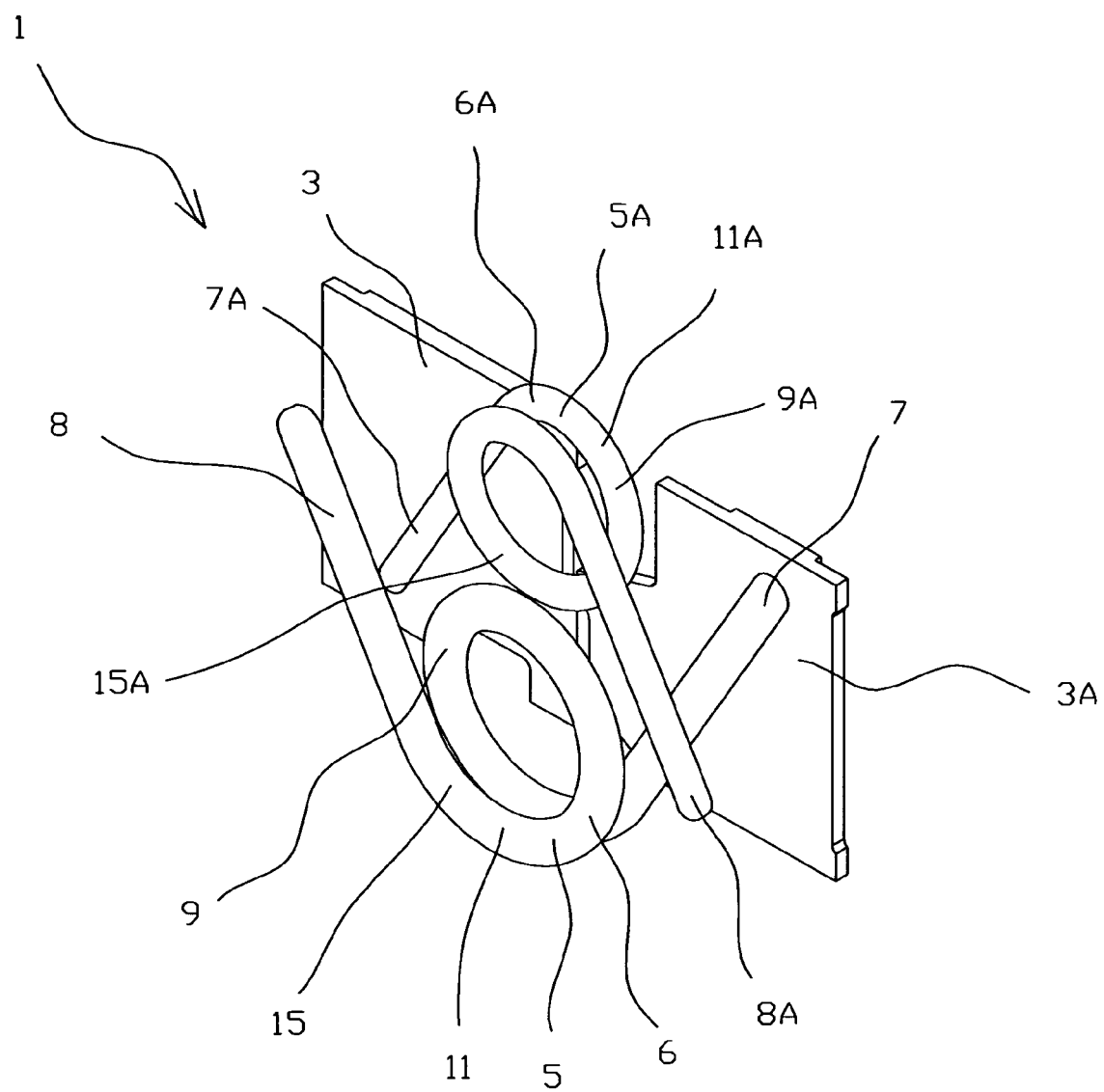
FIG. 3 is a perspective view showing the preferred embodiment of the heat transfer structure for the present invention. The high heat conductivity plate 4 is not shown.
Figure 4:
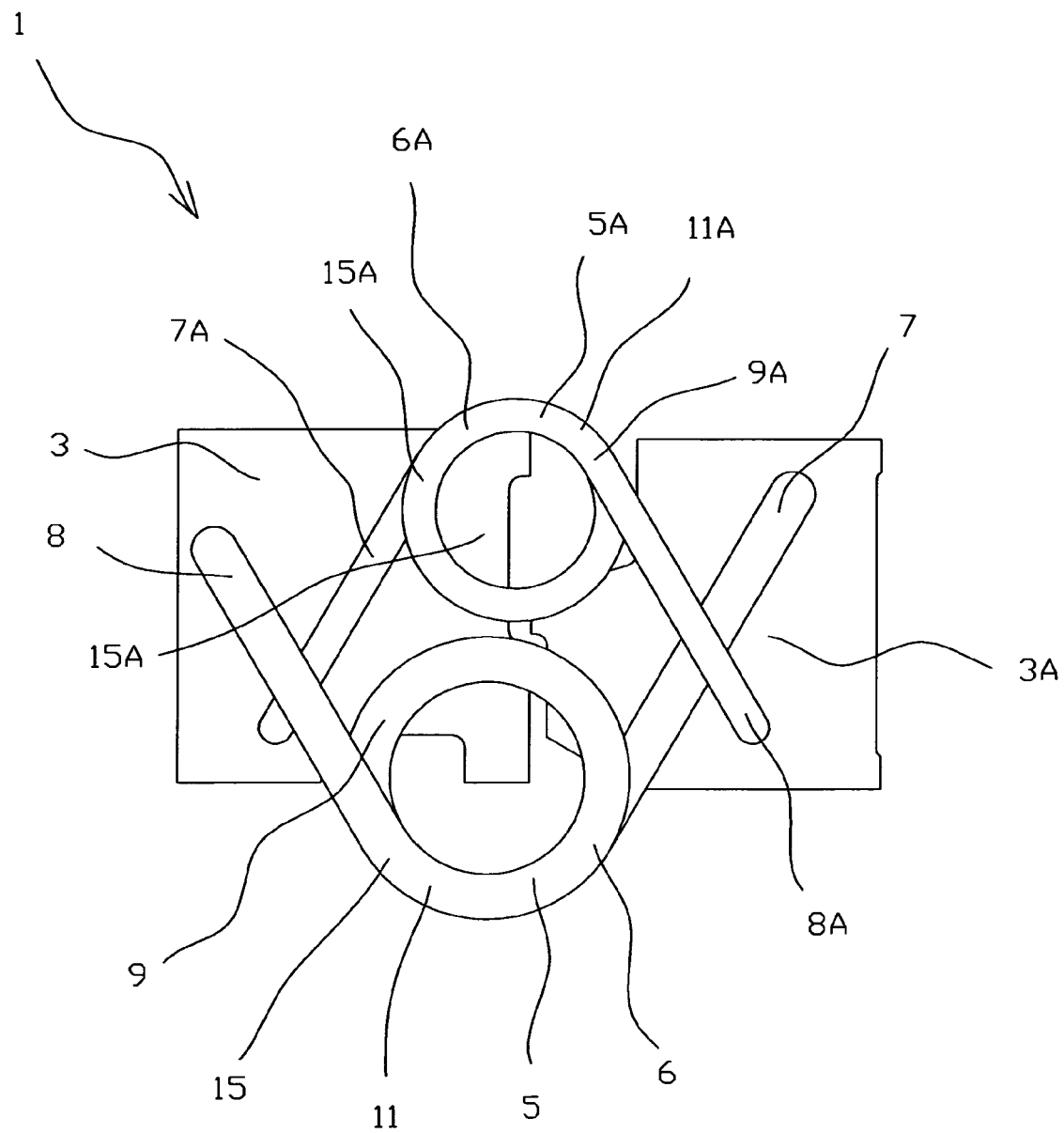
FIG. 4 is a plane top view showing the preferred embodiment of the heat transfer structure for the present invention. The high heat conductivity plate 4 is not shown.
Figure 5:
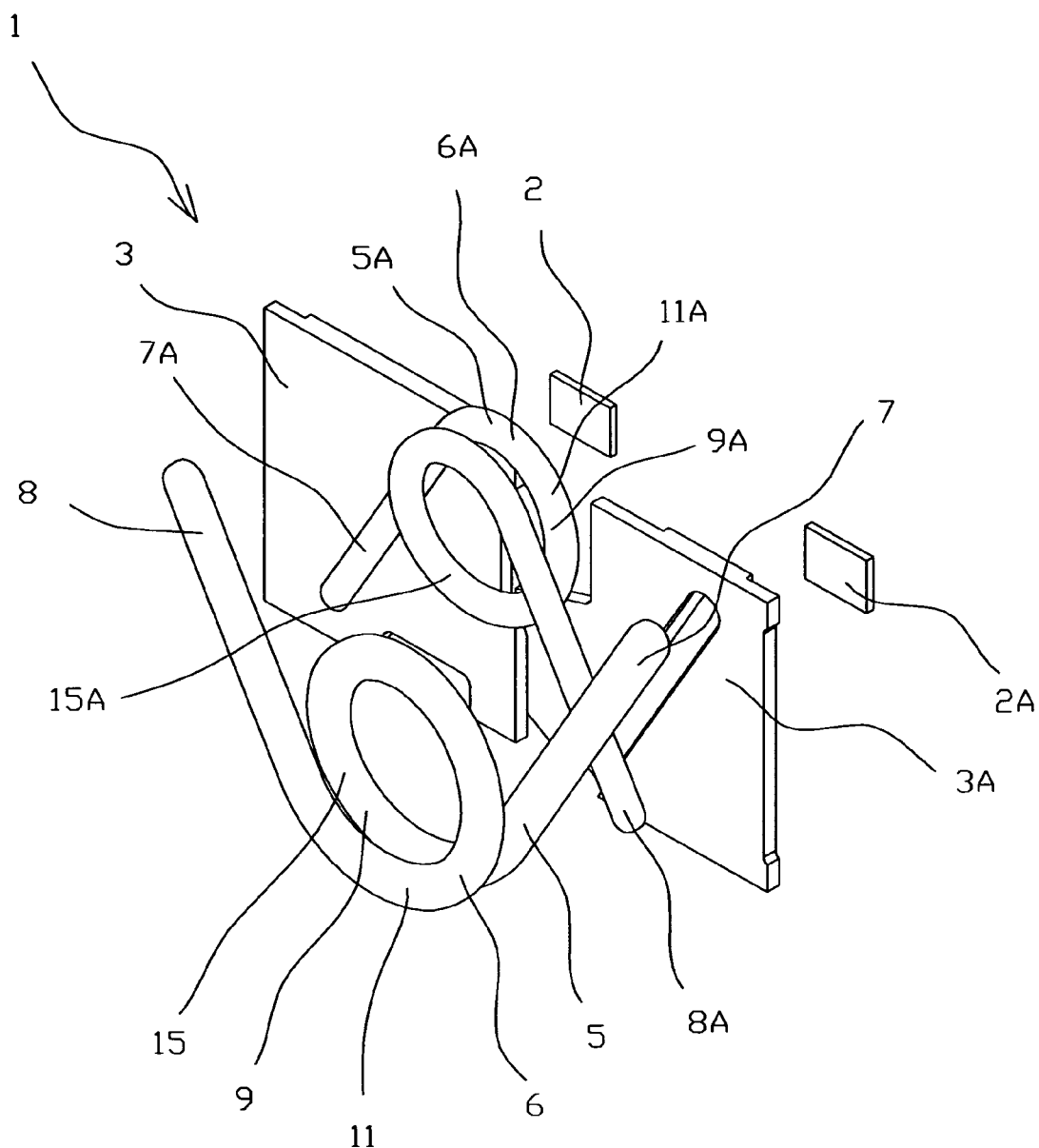
FIG. 5 is a perspective exploded view showing the preferred embodiment of the heat transfer structure for the present invention. The high heat conductivity plate 4 is not shown.
Figure 6:
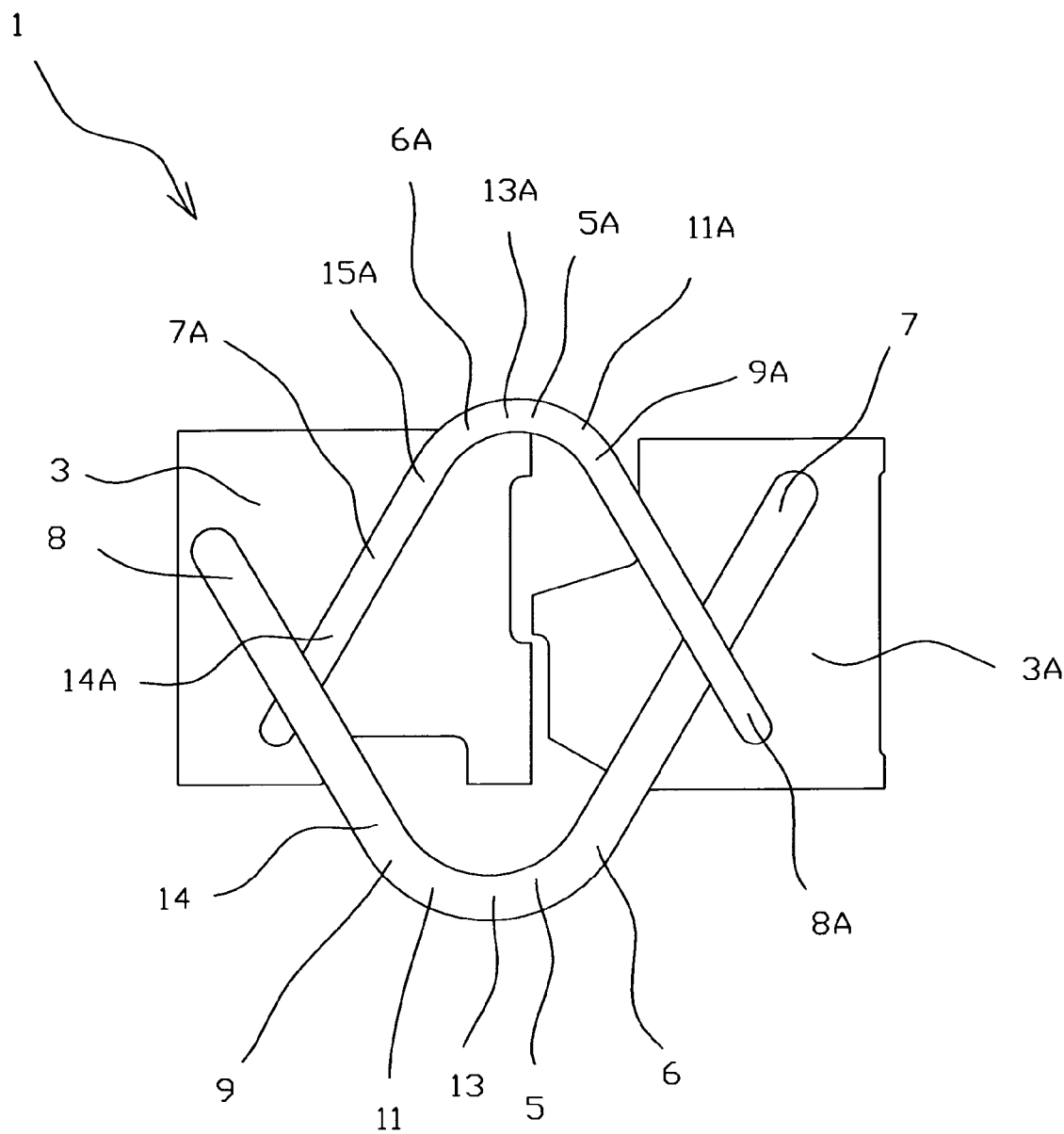
FIG. 6 is a plane top view showing the second embodiment of the heat transfer structure for the present invention. The high heat conductivity plate 4 is not shown.

Preferred embodiment of the present invention will be described in detail below with reference to the accompanying drawings.

FIGS. 1-9A show embodiments of the present invention.

The heat transfer structure 1 for electronic devices comprises at least two electronic devices 2 and 2A coupled with corresponding heat adaptors 3 and 3A, a high heat conductivity plate 4 and at least two heat pipes 5 and 5A spaced between the plate 4 and the heat adaptors 3 and 3A. Each of the heat pipes 5 and 5A comprises an adiabatic section 6 and 6A located between evaporating 7 and 7A and condensing 8 and 8A sections. Each of the heat adaptors 3 and 3A from one side is in a tight contact with the electronic device 2 and 2A while the other side is thermally connected with the evaporating section 7 and 7A of at least one of the heat pipes 5 and 5A. The adiabatic sections 6 and 6A are made like a bend 9 and 9A with at least one curvature radius (R on FIG. 7), thus serving like a displacement compensator 11 and 11A and the condensing sections 8 and 8A of each heat pipes 5 and 5A are thermally connected with the plate 4.

The heat adaptors 3 and 3A might be soldered or welded with at least a part of the evaporating sections 7 and 7A of the heat pipes 5 and 5A thus providing a good thermal contact between adaptors 3 and 3A and heat pipes 5 and 5A.

Figure 7:
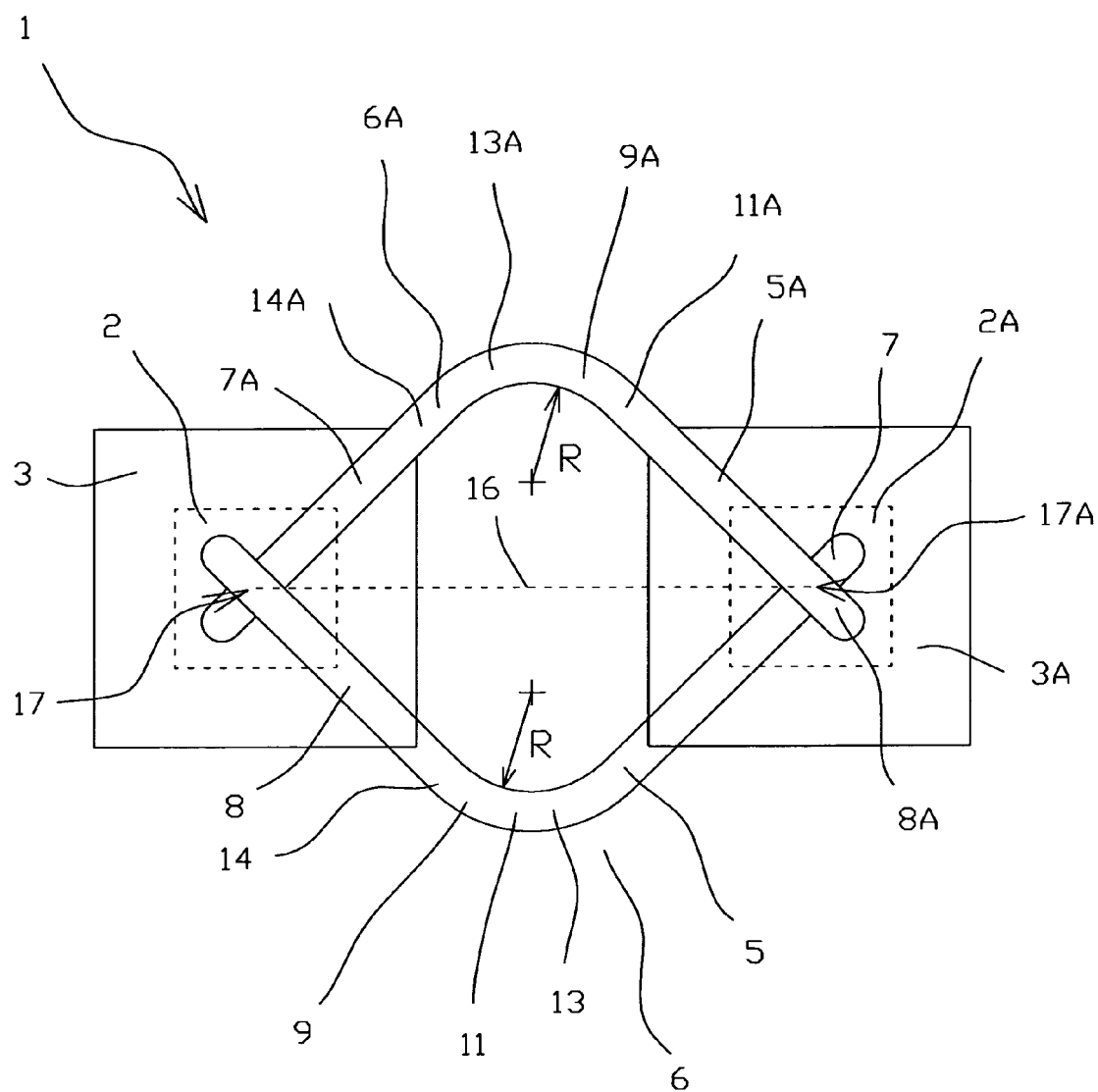
FIG. 7 is a plane top view showing geometrical relations of the second embodiment of the heat transfer structure for the present invention. The high heat conductivity plate 4 is not shown.

The preferred embodiment according to the present invention comprises two electronic devices 2 and 2A, two heat adaptors 3 and 3A and two heat pipes 5 and 5A; each of the heat adaptors 3 and 3A is thermally connected with one of the heat pipes 5 and 5A correspondingly. Each of the heat pipes 5 and 5A is V-shaped in plane view, thus the compensator 11 and 11A located at the vertexes 13 and 13A (FIGS. 1, 6 and 7) of the V-shape form that made like a spiral 15 and 15A. The heat pipes 5 and 5A in plane view are located substantially symmetrically in respect to the line 16 connected the centers 17 and 17A of the electronic devices 2 and 2A (FIG. 7).

Figure 8:
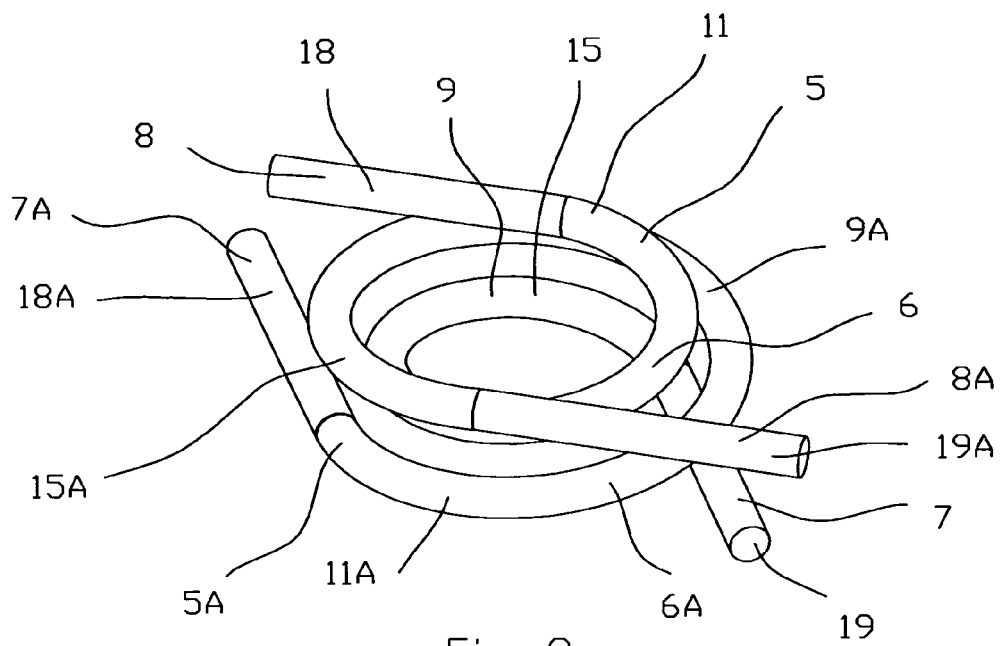
FIG. 8 is a perspective view showing a mutual layout of the heat pipes according to the third embodiment of the heat transfer structure for the present invention.
Figure 8A:
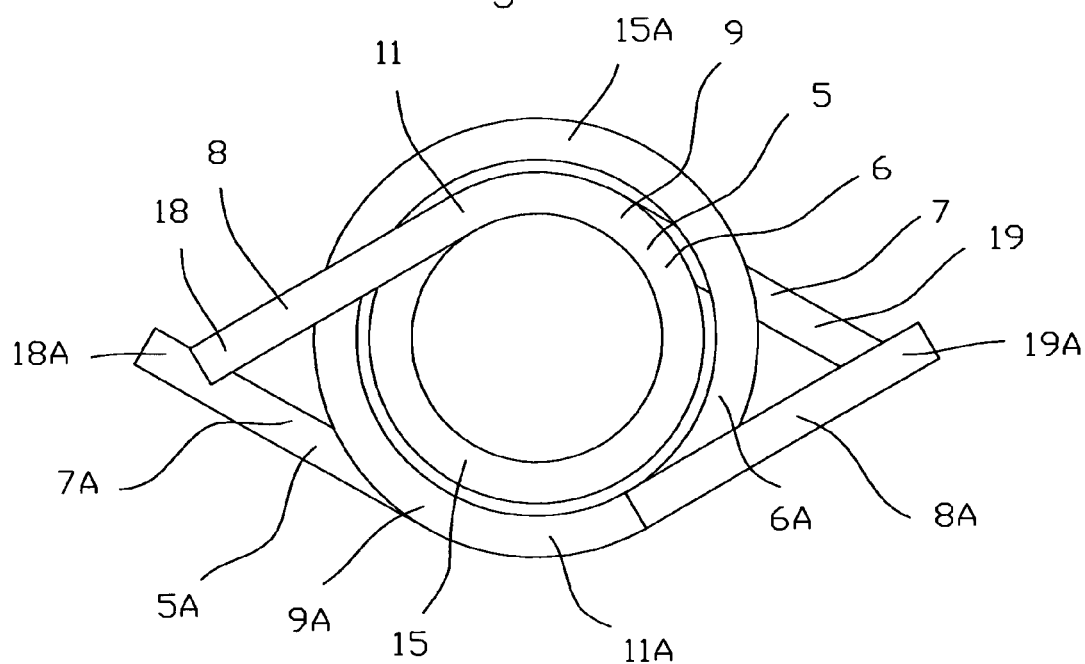
FIG. 8A is a plane top view showing a mutual layout of the heat pipes according to the third embodiment of the heat transfer structure for the present invention.
Figure 9:
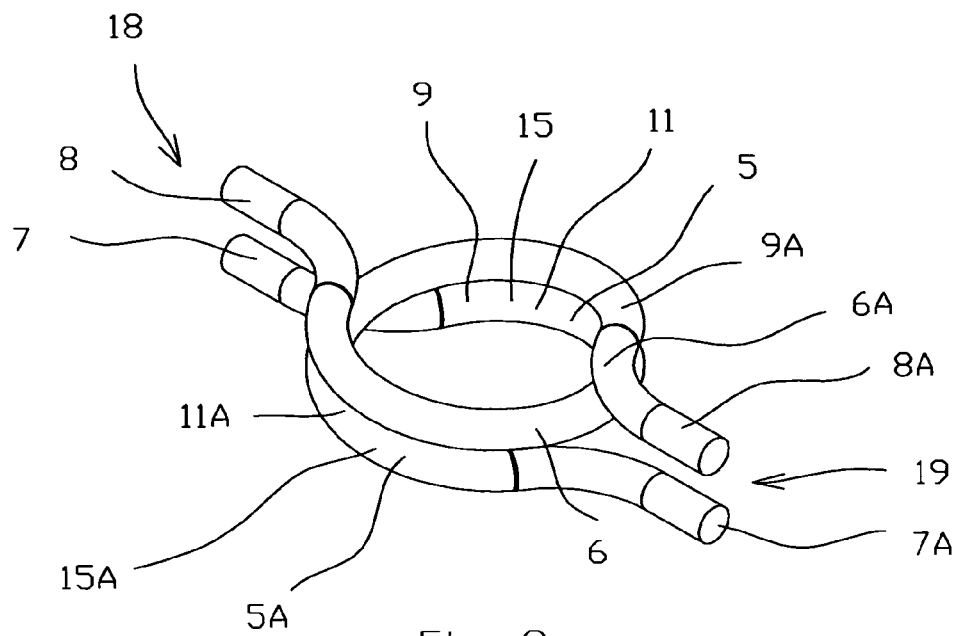
FIG. 9 is a perspective view showing a mutual layout of the heat pipes according to the fourth embodiment of the heat transfer structure for the present invention.
Figure 9A:
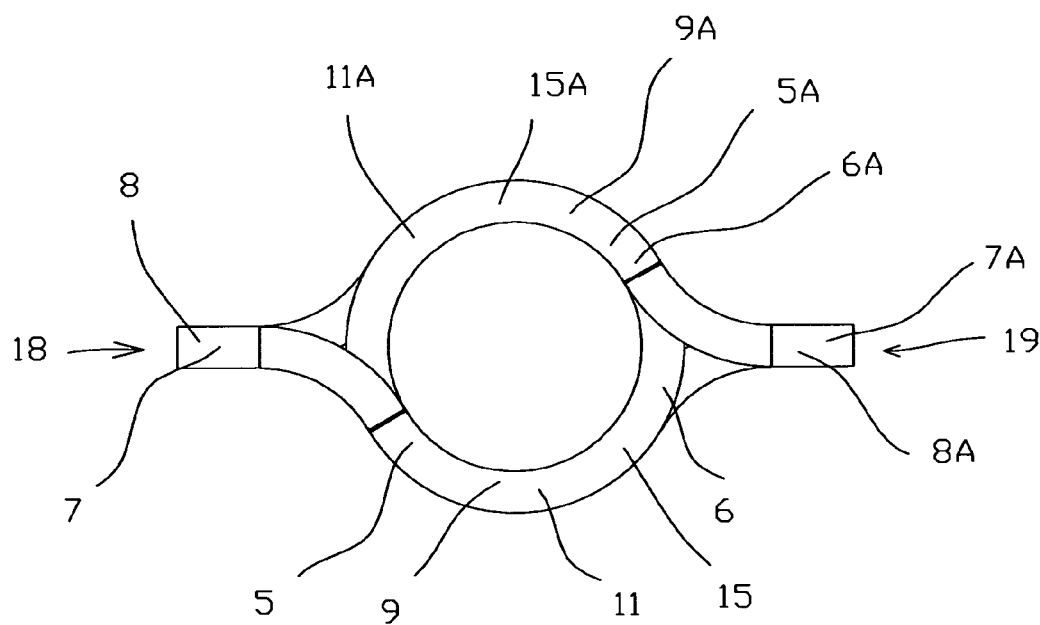
FIG. 9A is a plane top view showing a mutual layout of the heat pipes according to the fourth embodiment of the heat transfer structure for the present invention

According to the other embodiment of the present invention (FIGS. 9 and 9A) evaporating 7 and 7A and condensing 8 and 8A sections of each heat pipes 5 and 5A are in parallel and spaced on the one side 18 and 18A of the spiral 15 and 15A. And according to the variant of this embodiment (FIGS. 8 and 8A) evaporating 7 and 7A and condensing sections 8 and 8A of each heat pipes 5 and 5A are in parallel planes and spaced on the opposite sides 18 and 18A and 19 and 19A of the spiral 15 and 15A.

The heat transfer structure 1 for electronic devices 2 and 2A operates in the following way. Due to the heat pipes 5 and 5A adiabatic sections 6 and 6A that serve like the displacement compensators 11 and 11A, they are compensating all angular and linear miss aliments between the heat adaptors 3 and 3A with the electronic devices 2 and 2A accordantly. Such design provides a good contact with low thermal resistance between all parts of the heat transfer structure 1. When electric power is supplied to the electronic devices 2 and 2A the intensive process of heat generating takes place and heat is spreading to the heat adaptors 3 and 3A. Due to the tight contact between the heat adaptors 3 and 3A and the evaporating sections 7 and 7A of the heat pipes 5 and 5A, heat is transferred sufficiently to the condensing sections 8 and 8A of the heat pipes 5 and 5A and, further to the high heat conductivity plate 4. Since the heat pipes characterized by the highest heat conductivity the heat transferred at the minimum thermal resistance. Usually the plate 4 integrated with a conventional blower-assisted heatsink (not shown on FIGS.), therefore heat transferred to the ambient air thus realize a high efficiency cooling process.

Therefore, the heat transfer structure 1 due to the mutual arrangement of the heat pipes 5 and 5A by described spatial geometry according to the present invention provides a compact, high efficient, simple, reliable and less expensive cooling solution.

While the invention has been described with reference to various embodiments, it will be understood that these embodiments are only illustrative that the scope of invention is not limited to them. Many variations, modifications and improvements of the embodiments described are possible. Variations and modifications of the embodiments disclosed herein may be made based on description set forth herein, without departing from the scope and spirit of the invention as set forth in the following claims.

What is claimed is:

1. A heat transfer structure for electronic devices comprising at least two electronic devices coupled with corresponding heat adaptors, a high heat conductivity plate and at least two heat pipes being spaced between said plate and said heat adaptors, wherein:

(i) each of said heat pipes comprising an adiabatic section located between evaporating and condensing sections;
(ii) each of said heat adaptors from one side being in a tight contact with said electronic device while the other side being thermally connected with said evaporating section of at least one of said heat pipes;
(iii) said adiabatic section being made like a spiral, thus serving like a displacement compensator;
(iv) said condensing section of each said heat pipes being thermally connected with said plate.

2. The structure as claimed in claim 1, wherein said heat adaptors being soldered with at least a part of said evaporating section of said heat pipes.

3. The structure as claimed in claim 1, wherein said structure comprising two said electronic devices, two said heat adaptors and two said heat pipes; each of said heat adaptors being thermally connected with one of said heat pipes correspondingly.

4. The structure as claimed in claim 3, wherein each of said heat pipes being V-shaped in plane view, thus said compensator located at the vertex of said V-shape form.

5. The structure as claimed in claim 4, wherein said heat pipes in plane view being located substantially symmetrically in respect to a line connected the centers of said electronic devices.

6. The structure as claimed in claim 4, wherein said evaporating and condensing sections of each said heat pipes being in parallel and spaced on one side of said spiral.

7. The structure as claimed in claim 4, wherein said evaporating and condensing sections of each said heat pipes being in parallel planes and spaced on opposite sides of said spiral.

* * * * *